United States Patent
Hemink

(10) Patent No.: US 7,843,739 B2
(45) Date of Patent: *Nov. 30, 2010

(54) SYSTEM FOR VERIFYING NON-VOLATILE STORAGE USING DIFFERENT VOLTAGES

(75) Inventor: Gerrit Jan Hemink, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/203,544

(22) Filed: Sep. 3, 2008

(65) Prior Publication Data

US 2008/0316829 A1    Dec. 25, 2008

Related U.S. Application Data

(62) Division of application No. 11/421,682, filed on Jun. 1, 2006, now Pat. No. 7,457,163.

(51) Int. Cl.
G11C 11/34     (2006.01)
G11C 16/06     (2006.01)

(52) U.S. Cl. .................. 365/185.21; 365/185.11; 365/185.18; 365/185.22; 365/185.24

(58) Field of Classification Search ............ 365/185.11, 365/185.18, 185.21, 185.22, 185.24
See application file for complete search history.

(56) References Cited

U.S. PATENT DOCUMENTS

| | | |
|---|---|---|
| 5,124,945 A | 6/1992 | Schreck |
| 5,532,962 A | 7/1996 | Auclair |
| 5,539,690 A | 7/1996 | Talreja |
| 5,657,332 A | 8/1997 | Auclair |
| 5,764,572 A | 6/1998 | Hammick |
| 5,862,074 A | 1/1999 | Park |
| 5,867,429 A | 2/1999 | Chen |
| 5,943,260 A | 8/1999 | Hirakawa |
| 5,946,231 A | 8/1999 | Endoh |
| 5,995,417 A | 11/1999 | Chen |
| 6,044,019 A | 3/2000 | Cernea |
| 6,046,935 A | 4/2000 | Takeuchi |
| 6,069,822 A | 5/2000 | Canegallo |
| 6,144,580 A | 11/2000 | Murray |

(Continued)

FOREIGN PATENT DOCUMENTS

EP    01271553    1/2003

(Continued)

OTHER PUBLICATIONS

Office Action dated Oct. 8, 2008, U.S. Appl. No. 11/933,632, filed Nov. 1, 2007.

(Continued)

*Primary Examiner*—Ly D Pham
(74) *Attorney, Agent, or Firm*—Vierra Magen Marcus & DeNiro LLP

(57) ABSTRACT

When performing a data sensing operation, including a verify operation during programming of non-volatile storage elements (or, in some cases, during a read operation after programming), a first voltage is used for unselected word lines that have been subjected to a programming operation and a second voltage is used for unselected word lines that have not been subjected to a programming operation. In some embodiments, the second voltage is lower than the first voltage.

7 Claims, 14 Drawing Sheets

U.S. PATENT DOCUMENTS

| | | | |
|---|---|---|---|
| 6,154,157 A | 11/2000 | Wong | |
| 6,160,739 A | 12/2000 | Wong | |
| 6,175,522 B1 | 1/2001 | Fang | |
| 6,181,599 B1 | 1/2001 | Gongwer | |
| 6,222,762 B1 | 4/2001 | Guterman | |
| 6,259,632 B1 | 7/2001 | Khouri | |
| 6,285,593 B1 | 9/2001 | Wong | |
| 6,345,000 B1 | 2/2002 | Wong | |
| 6,349,055 B1 | 2/2002 | Murray | |
| 6,456,528 B1 | 9/2002 | Chen | |
| 6,462,988 B1 | 10/2002 | Harari | |
| 6,504,762 B1 | 1/2003 | Harari | |
| 6,522,580 B2 | 2/2003 | Chen | |
| 6,532,556 B1 | 3/2003 | Wong | |
| 6,535,423 B2 | 3/2003 | Trivedi | |
| 6,542,407 B1 | 4/2003 | Chen | |
| 6,570,785 B1 | 5/2003 | Mangan | |
| 6,570,790 B1 | 5/2003 | Harari | |
| 6,614,070 B1 | 9/2003 | Hirose | |
| 6,643,188 B2 | 11/2003 | Tanaka | |
| 6,657,891 B1 | 12/2003 | Shibata | |
| 6,717,847 B2 | 4/2004 | Chen | |
| 6,717,851 B2 | 4/2004 | Mangan | |
| 6,760,068 B2 | 7/2004 | Petropoulos et al. | |
| 6,771,536 B2 | 8/2004 | Li | |
| 6,781,877 B2 | 8/2004 | Cernea | |
| 6,807,095 B2 | 10/2004 | Chen | |
| 6,859,397 B2 | 2/2005 | Lutze | |
| 6,870,766 B2 | 3/2005 | Cho | |
| 6,870,768 B2 | 3/2005 | Cernea | |
| 6,888,758 B1 | 5/2005 | Hemink | |
| 6,956,770 B2 | 10/2005 | Khalid | |
| 6,975,538 B2 | 12/2005 | Abedifard | |
| 7,009,881 B2 | 3/2006 | Noguchi | |
| 7,012,838 B2 | 3/2006 | Kasa | |
| 7,020,017 B2 | 3/2006 | Chen | |
| 7,170,788 B1 | 1/2007 | Wan | |
| 7,177,199 B2 * | 2/2007 | Chen et al. | 365/185.28 |
| 2002/0034100 A1 * | 3/2002 | Sakui et al. | 365/185.22 |
| 2002/0051383 A1 | 5/2002 | Mangan | |
| 2002/0159315 A1 | 10/2002 | Noguchi | |
| 2003/0112663 A1 | 6/2003 | Quader | |
| 2003/0128586 A1 | 7/2003 | Chen | |
| 2003/0137873 A1 | 7/2003 | Kawamura | |
| 2003/0137888 A1 | 7/2003 | Chen | |
| 2003/0161182 A1 | 8/2003 | Li | |
| 2003/0218920 A1 | 11/2003 | Harari | |
| 2004/0012998 A1 | 1/2004 | Chien | |
| 2004/0027865 A1 | 2/2004 | Mangan | |
| 2004/0042270 A1 | 3/2004 | Huang | |
| 2004/0047182 A1 | 3/2004 | Cernea | |
| 2004/0057283 A1 | 3/2004 | Cernea | |
| 2004/0057285 A1 | 3/2004 | Cernea | |
| 2004/0057287 A1 | 3/2004 | Cernea | |
| 2004/0057318 A1 | 3/2004 | Cernea | |
| 2004/0060031 A1 | 3/2004 | Cernea | |
| 2004/0079988 A1 | 4/2004 | Harari | |
| 2004/0109357 A1 | 6/2004 | Cernea | |
| 2004/0156241 A1 | 8/2004 | Mokhlesi | |
| 2004/0179404 A1 | 9/2004 | Quader | |
| 2004/0190337 A1 | 9/2004 | Chen | |
| 2004/0213031 A1 | 10/2004 | Hosono | |
| 2005/0057967 A1 | 3/2005 | Khalid | |
| 2005/0162913 A1 | 7/2005 | Chen | |
| 2005/0254302 A1 * | 11/2005 | Noguchi | 365/185.17 |
| 2005/0286299 A1 * | 12/2005 | Tomita et al. | 365/185.11 |
| 2006/0120161 A1 * | 6/2006 | Confalonieri et al. | 365/185.22 |
| 2006/0221660 A1 | 10/2006 | Hemink | |
| 2006/0221692 A1 | 10/2006 | Chen | |
| 2007/0047314 A1 | 3/2007 | Goda | |
| 2007/0121383 A1 | 5/2007 | Chen | |
| 2007/0206421 A1 * | 9/2007 | Mokhlesi | 365/185.18 |
| 2007/0206426 A1 * | 9/2007 | Mokhlesi | 365/189.07 |
| 2007/0242510 A1 | 10/2007 | Hemink | |
| 2007/0279994 A1 | 12/2007 | Mokhlesi | |
| 2007/0279995 A1 | 12/2007 | Mokhlesi | |

FOREIGN PATENT DOCUMENTS

| | | |
|---|---|---|
| EP | 01329898 | 7/2003 |
| WO | WO03025512 | 3/2003 |
| WO | WO2006107731 | 10/2006 |

OTHER PUBLICATIONS

European Office Action dated Nov. 2, 1009, European Patent Appl. No. 07797703.1, filed May 23, 2007.

Notice of Allowance and Fee(s) Due dated Mar. 20, 2009 in U.S. Appl. No. 11/933,632.

International Preliminary Report of Patentability, dated Dec. 3, 2008, PCT Appl. No. PCT/US2007/069590, filed May 23, 2007.

Written Opinion of the International Searching Aurthority, dated Dec. 3, 2008, PCT Appl. No. PCT/US2007/069590, filed May 23, 2007.

International Preliminary Report of Patentability, dated Dec. 3, 2008, PCT Appl. No. PCT/US2007/069589, filed May 23, 2007.

Written Opinion of the International Searching Authority, dated Dec. 3, 2008, PCT Appl. No. PCT/US2007/069589, filed May 23, 2007.

Taiwan Office Action dated May 25, 2010, Taiwan Patent Application No. 096117615.

European Response to Office Action dated May 10, 2010, European Patent Application No. 07797703.1.

Korean Office Action dated Mar. 2, 2010, Korean Patent Application No. 10-2008-7023381.

Korean Written Response and Amendment dated Sep. 2, 2010, Korean Patent Application No. 7023381/2008.

* cited by examiner

Fig. 9
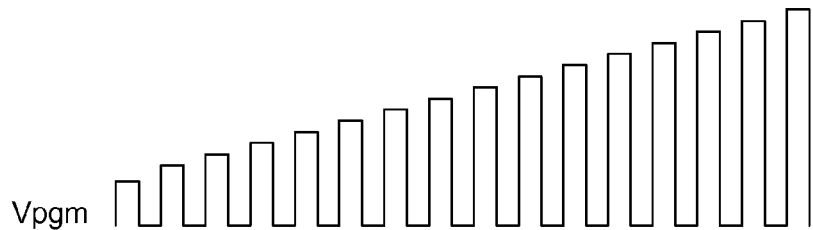
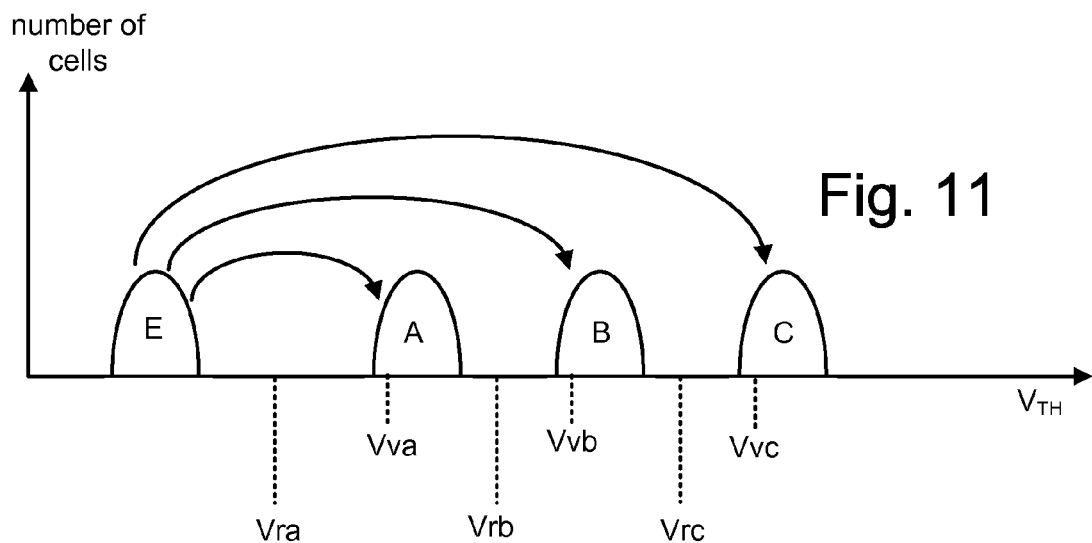
Fig. 11
Fig. 12
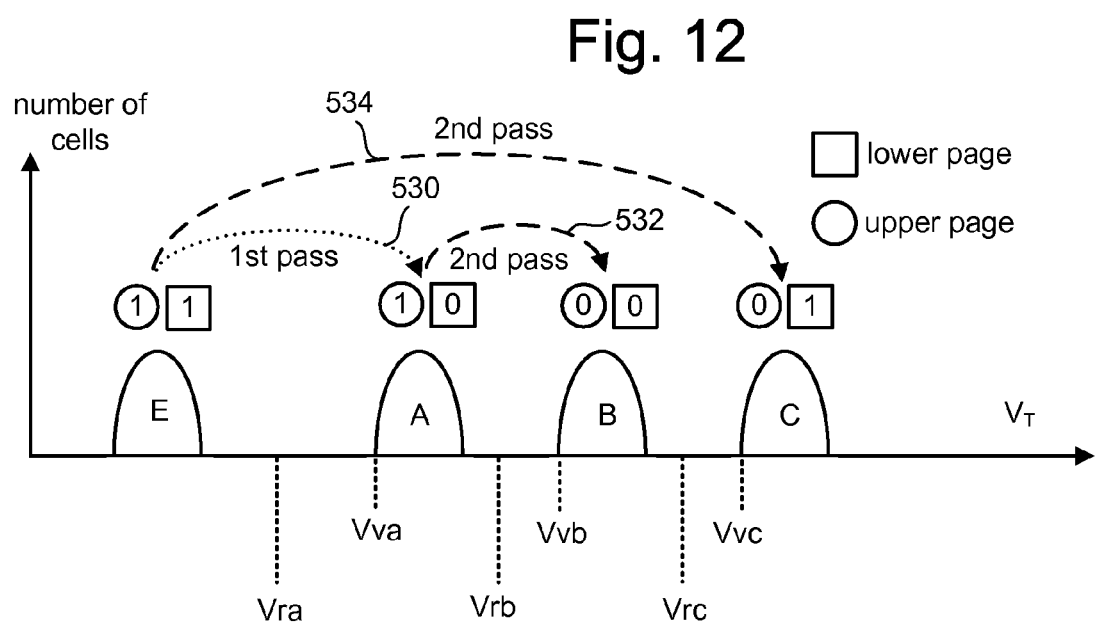

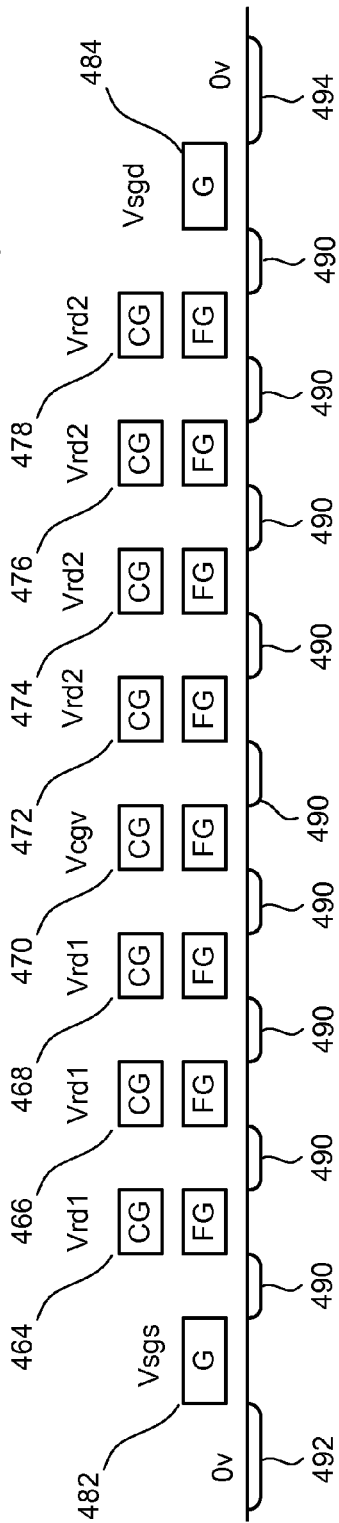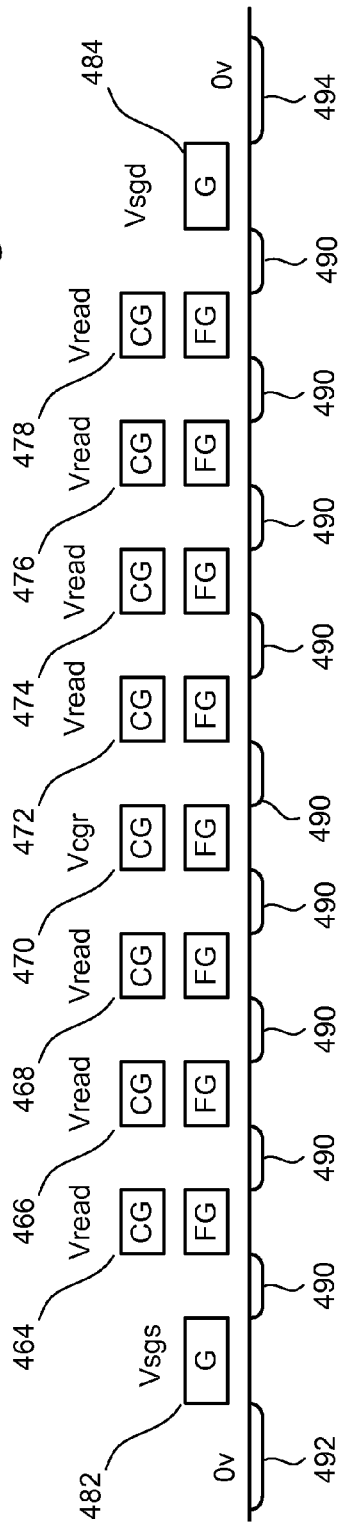

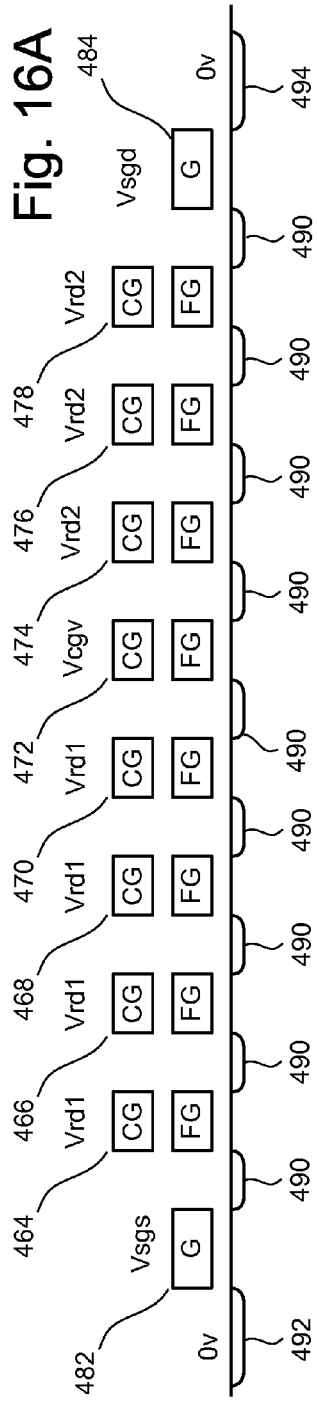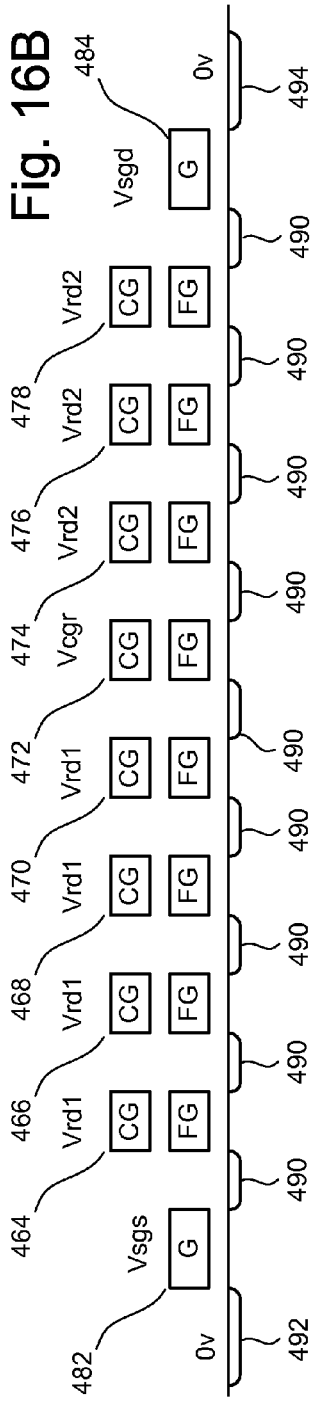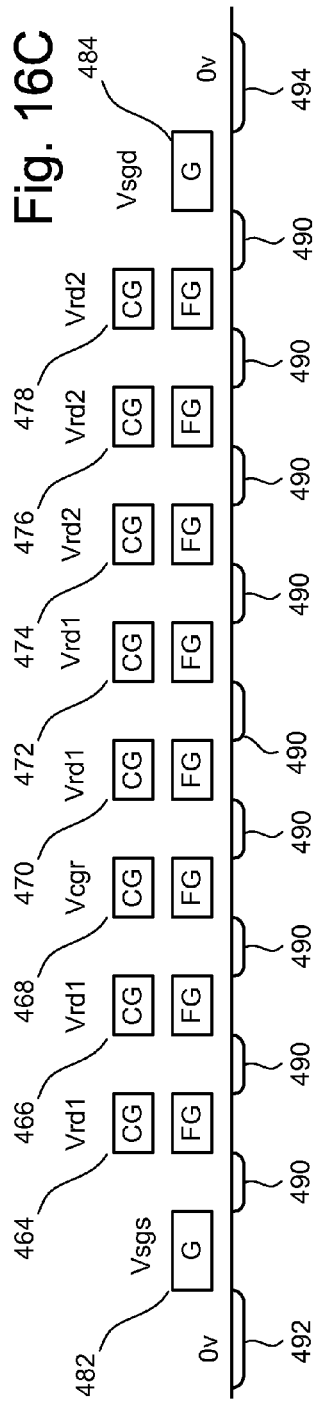

SYSTEM FOR VERIFYING NON-VOLATILE STORAGE USING DIFFERENT VOLTAGES

CROSS-REFERENCE TO RELATED APPLICATIONS

This application is a divisional of U.S. application Ser. No. 11/421,682, "System For Verifying Non-Volatile Storage Using Different Voltages," filed on Jun. 1, 2006, incorporated herein by reference.

This application is related to U.S. patent application Ser. No. 11/421,667, entitled "Verify Operation for Non-Volatile Storage Using Different Voltages," by Gerrit Jan Hemink, filed Jun. 1, 2006.

BACKGROUND OF THE INVENTION

1. Field of the Invention

The present invention relates to technology for non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory," all three cited patents are incorporated herein by reference in their entirety.

In many cases, the program voltage is applied to the control gate as a series of pulses (referred to as programming pulses), with the magnitude of the pulses increasing at each pulse. Between programming pulses, a set of one or more verify operations are performed to determined whether the memory cell(s) being programmed have reached their target level. If a memory cell has reached its target level, programming stops for that memory cell. If a memory cell has not reached its target level, programming will continue for that memory cell.

One example of a flash memory system uses the NAND structure, which includes arranging multiple transistors in series between two select gates. The transistors in series and the select gates are referred to as a NAND string.

In a typical NAND flash memory device, memory cells are programmed in a certain order wherein the memory cells on the word line that is next to the source side select gate are programmed first. Subsequently, the memory cells on the adjacent word line are programmed, followed by the programming of memory cells on the next adjacent word line, and so on, until the memory cells on the last word line next to the drain side select gate are programmed.

As more memory cells in a NAND string are programmed, the conductivity of the channel areas under the unselected word lines will decrease because programmed memory cells have a higher threshold voltage than memory cells that are in the erased state. This increasing of channel resistance changes the IV characteristics of the memory cells. When a particular memory cell was being programmed (and verified), all the memory cells on the word lines higher than the selected word line were still in the erased state. Therefore, the channel area under those word lines was conducting very well, resulting in a relatively high cell current during the actual verify operation. However, after all memory cells of the NAND string have been programmed to their desired state, the conductivity of the channel area under those word lines usually decreases as most of the cells will be programmed to one of the programmed states (while a smaller number, on average 25%, will stay in the erased state). As a result, the IV characteristics change since less current will flow than compared to previous verify operation performed during programming. The lowered current causes an artificial shift of the threshold voltages for the memory cells, which can lead to errors when reading data. This effect is referred to as the back pattern effect.

SUMMARY OF THE INVENTION

Technology is described herein for reducing errors from the back pattern effect. When performing a data sensing operation, including a verify operation during programming of non-volatile storage elements (or, in some cases, during a read operation after programming), a first voltage is used for unselected word lines that have been subjected to a programming operation and a second voltage is used for unselected word lines that have not been subjected to a programming operation.

One embodiment includes applying a particular voltage to a particular non-volatile storage element of a group of connected non-volatile storage elements, applying a first voltage to one or more non-volatile storage elements of the group that have already been subjected to one or more programming process since a last relevant erase, applying a second voltage to two or more non-volatile storage elements of the group that have not been subjected to a programming process since a last relevant erase, and sensing a condition related to the particular non-volatile storage element in response to the applying of the particular voltage. The first voltage and second voltage are applied while applying the particular voltage.

One embodiment includes applying a particular voltage to a particular non-volatile storage element of a group of connected non-volatile storage elements, applying a first voltage to one or more non-volatile storage elements of the group that are on a source side of the particular non-volatile storage element, applying a second voltage to two or more non-volatile storage elements of the group that are on a drain side of the particular non-volatile storage element, and sensing a condition related to the particular non-volatile storage element and the particular voltage. The first voltage and the second are applied in association with applying the particular voltage.

One embodiment includes applying a particular voltage to a particular non-volatile storage element of a group of connected non-volatile storage elements, applying a first voltage to one or more non-volatile storage elements of the group that have already been subjected to one or more programming processes since a last relevant erase, applying a second voltage to one or more non-volatile storage elements of the group that have not already been subjected to a programming processes since a last relevant erase, applying a third voltage to a non-volatile storage element that is a neighbor of the particular non-volatile storage element, and sensing a condition related to the particular non-volatile storage element and the particular voltage. The first voltage, second voltage and third voltage are applied in coordination with the particular voltage.

One embodiment includes applying a particular voltage to a particular non-volatile storage element of a group of connected non-volatile storage elements, applying a first voltage to one or more non-volatile storage elements of the group that are on a source side of the particular non-volatile storage element, applying a second voltage to a first set of one or more non-volatile storage elements of the group that are on a drain side of the particular non-volatile storage element, applying the first voltage to a second set of one or more non-volatile storage elements of the group that are on the drain side of the particular non-volatile storage element, and sensing a condition related to the particular non-volatile storage element as part of a read operation that includes the applying of the first voltage and the second voltage.

One example implementation comprises a plurality of non-volatile storage elements and a managing circuit in communication with the plurality of non-volatile storage elements for performing the processes discussed herein.

BRIEF DESCRIPTION OF THE DRAWINGS

FIG. 9 is an example wave form applied to the control gates of non-volatile memory cells.
FIG. 10A depicts a NAND string and a set of voltages applied to the NAND string during a verify operation.
FIG. 10B depicts a NAND string and a set of voltages applied to the NAND string during a read operation.
FIG. 11 depicts an example set of threshold voltage distributions.
FIG. 12 depicts an example set of threshold voltage distributions.

FIG. 16A depicts a NAND string and a set of voltages applied to the NAND string during a verify process.
FIG. 16B depicts a NAND string and a set of voltages applied to the NAND string during a read process.
FIG. 16C depicts a NAND string and a set of voltages applied to the NAND string during a read process.

DETAILED DESCRIPTION

Figure 1:
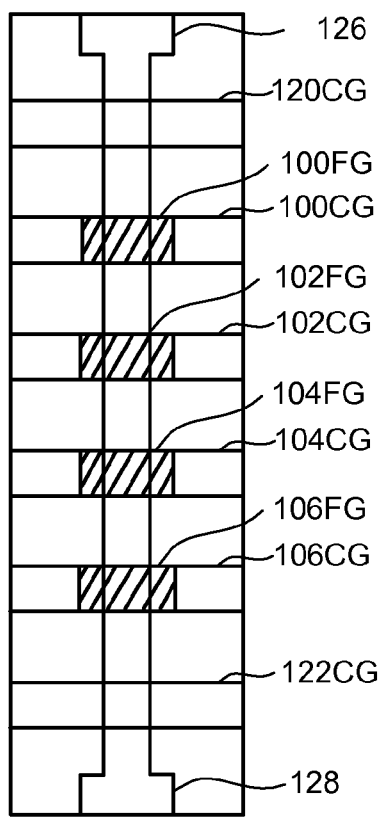
FIG. 1 is a top view of a NAND string.
Figure 2:
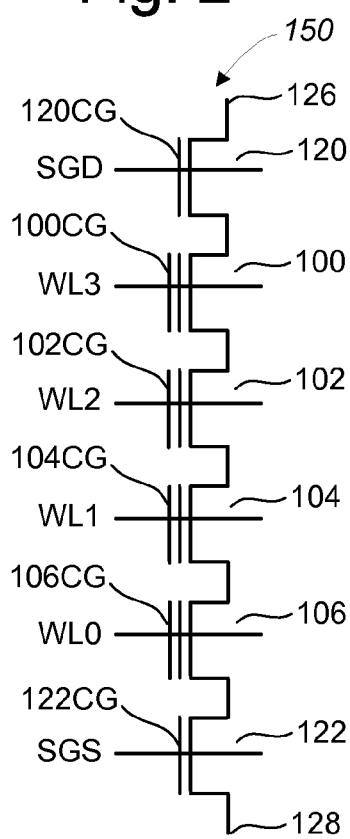
FIG. 2 is an equivalent circuit diagram of the NAND string.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 1 and 2. Select gate 120 is connected to select line SGD. Select gate 122 is connected to select line SGS.

Figure 3:
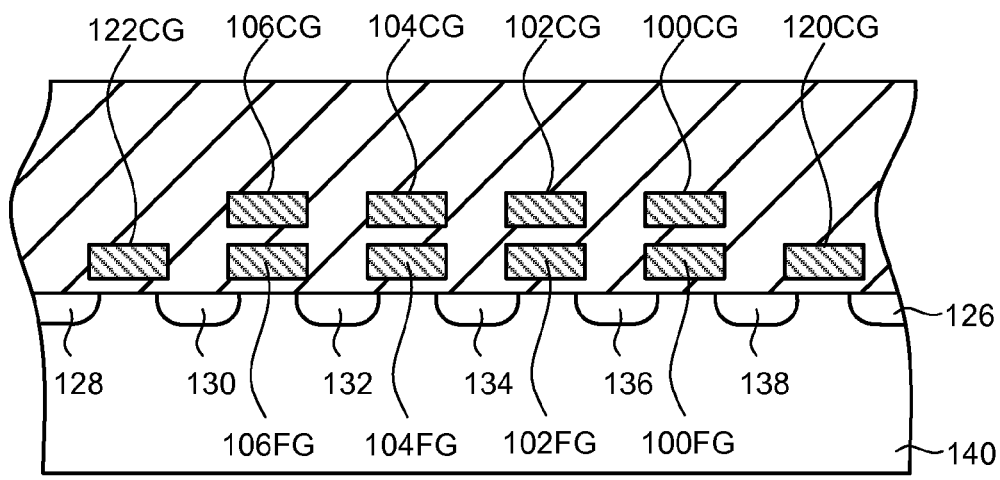
FIG. 3 is a cross-sectional view of the NAND string.

FIG. 3 provides a cross-sectional view of the NAND string described above. As depicted in FIG. 3, the transistors of the NAND string are formed in p-well region 140. Each transistor includes a stacked gate structure that consists of a control gate (100CG, 102CG, 104CG and 106CG) and a floating gate (100FG, 102FG, 104FG and 106FG). The control gates and the floating gates are typically formed by depositing polysilicon layers. The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped diffusion regions 130, 132, 134, 136 and 138 are shared between neighboring cells, through which the cells are connected to one another in series to form a NAND string. These N+ doped regions form the source and drain of each of the cells. For example, N+ doped region 130 serves as the drain of transistor 122 and the source for transistor 106, N+ doped region 132 serves as the drain for transistor 106 and the source for transistor 104, N+ doped region 134 serves as the drain for transistor 104 and the source for transistor 102, N+ doped region 136 serves as the drain for transistor 102 and the source for transistor 100, and N+ doped region 138 serves as the drain for transistor 100 and the source for transistor 120. N+ doped region 126 connects to the bit line for the NAND string, while N+ doped region 128 connects to a common source line for multiple NAND strings.

Note that although FIGS. 1-3 show four memory cells in the NAND string, the use of four transistors is provided only as an example. A NAND string used with the technology described herein can have less than four memory cells or more than four memory cells. For example, some NAND strings will include 8 memory cells, 16 memory cells, 32 memory cells, 64 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored. A memory cell storing one bit of digital data is referred to as a binary memory cell.

A memory cell can also store multiple bits of digital data. Such a memory cell is referred to as a multi-state memory cell. The threshold voltage window for a multi-state memory cell is divided into a number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00."

Relevant examples of NAND-type flash memories and their operation are provided in the following U.S. Patents/Patent Applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528; and U.S. patent application Ser. No. 09/893,277 (Publication No. US2003/0002348). Other types of non-volatile memory in addition to NAND flash memory can also be used with the present invention. For example, a so called TANOS structure (consisting of a stacked layer of TaN-$Al_2O_3$—SiN—$SiO_2$ on a silicon substrate), which is basically a memory cell using trapping of charge in a nitride layer (instead of a floating gate), can also be used with the present invention.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices.

Figure 4:
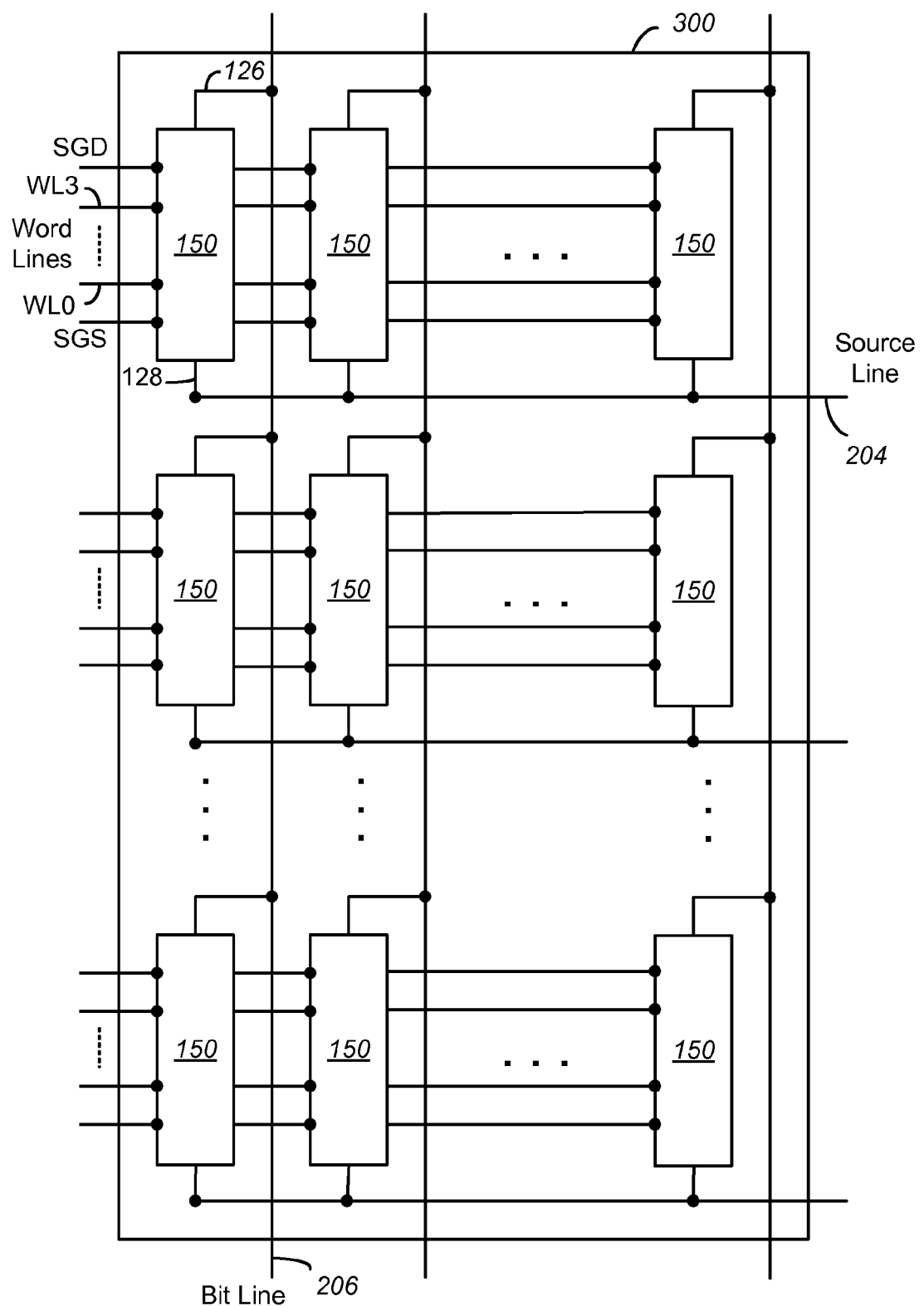
FIG. 4 is a block diagram of a portion of an array of NAND flash memory cells.

FIG. 4 illustrates an example of an array of NAND cells, such as those shown in FIGS. 1-3. Along each column, a bit line 206 is coupled to the drain terminal 126 of the drain select gate for the NAND string 150. Along each row of NAND strings, a source line 204 may connect all the source terminals 128 of the source select gates of the NAND strings. An example of a NAND architecture array and its operation as part of a memory system is found in U.S. Pat. Nos. 5,570,315; 5,774,397; and 6,046,935.

The array of memory cells is divided into a large number of blocks of memory cells. As is common for flash EEPROM systems, the block is the unit of erase. That is, each block contains the minimum number of memory cells that are erased together. Each block is typically divided into a number of pages. A page is a unit of programming. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages.

Figure 5:
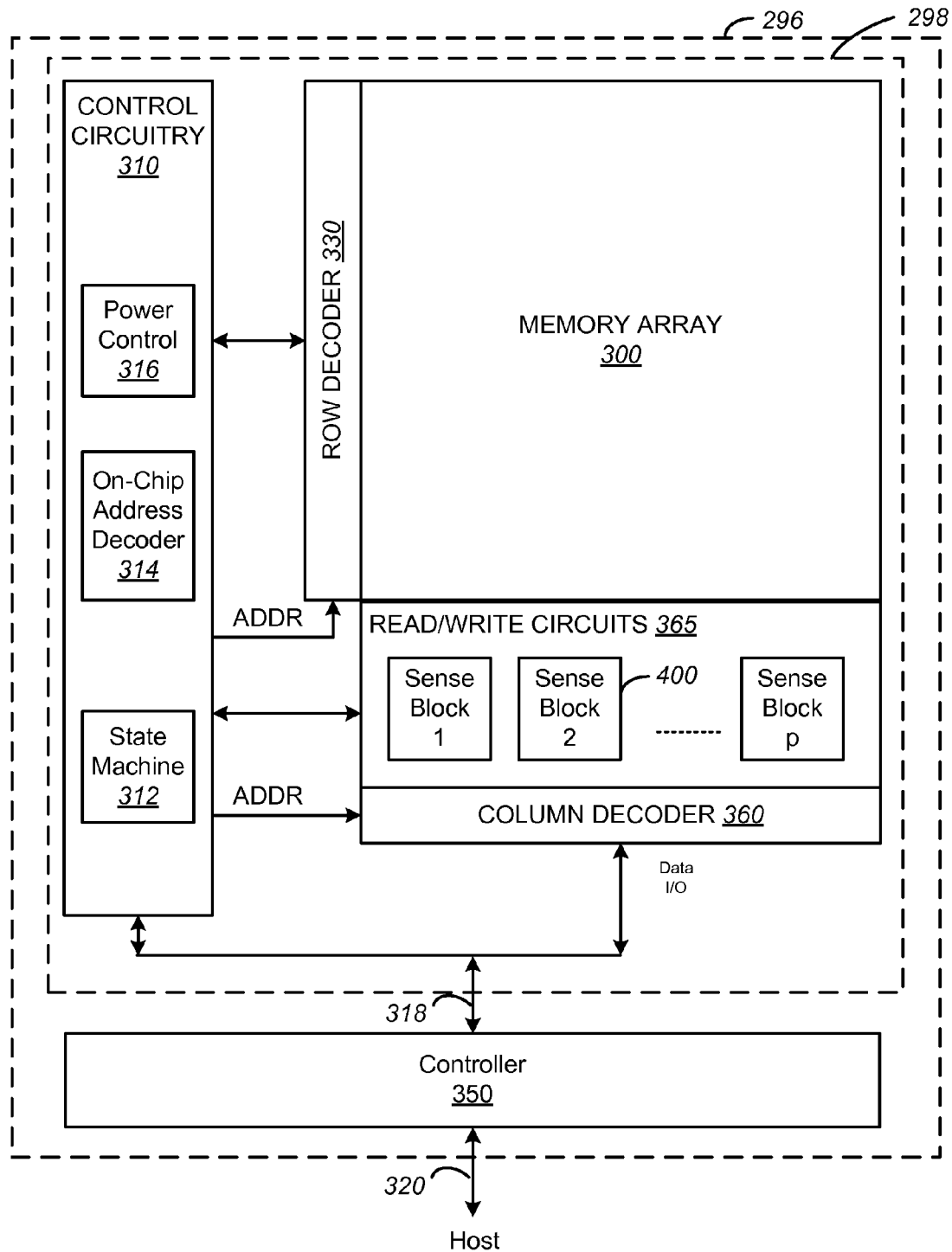
FIG. 5 is a block diagram of a non-volatile memory system.

FIG. 5 illustrates a memory device 296 having read/write circuits for reading and programming a page of memory cells in parallel, according to one embodiment of the present invention. Memory device 296 may include one or more memory die 298. Memory die 298 includes a two-dimensional array of memory cells 300, control circuitry 310, and read/write circuits 365. In some embodiments, the array of memory cells can be three dimensional. The memory array 300 is addressable by word lines via a row decoder 330 and by bit lines via a column decoder 360. The read/write circuits 365 include multiple sense blocks 400 and allow a page of memory cells to be read or programmed in parallel. Typically a controller 350 is included in the same memory device 296 (e.g., a removable storage card) as the one or more memory die 298. Commands and Data are transferred between the host and controller 350 via lines 320 and between the controller and the one or more memory die 298 via lines 318.

The control circuitry 310 cooperates with the read/write circuits 365 to perform memory operations on the memory array 300. The control circuitry 310 includes a state machine 312, an on-chip address decoder 314 and a power control module 316. The state machine 312 provides chip-level control of memory operations. The on-chip address decoder 314 provides an address interface between that used by the host or a memory controller to the hardware address used by the decoders 330 and 360. The power control module 316 controls the power and voltages supplied to the word lines and bit lines during memory operations.

In some implementations, some of the components of FIG. 5 can be combined. In various designs, one or more of the components of FIG. 5 (alone or in combination), other than memory cell array 300, can be thought of as a managing circuit. For example, a managing circuit may include any one of or a combination of control circuitry 310, state machine 312, decoders 314/360, power control 316, sense blocks 400, read/write circuits 365, controller 350, etc.

Figure 6:
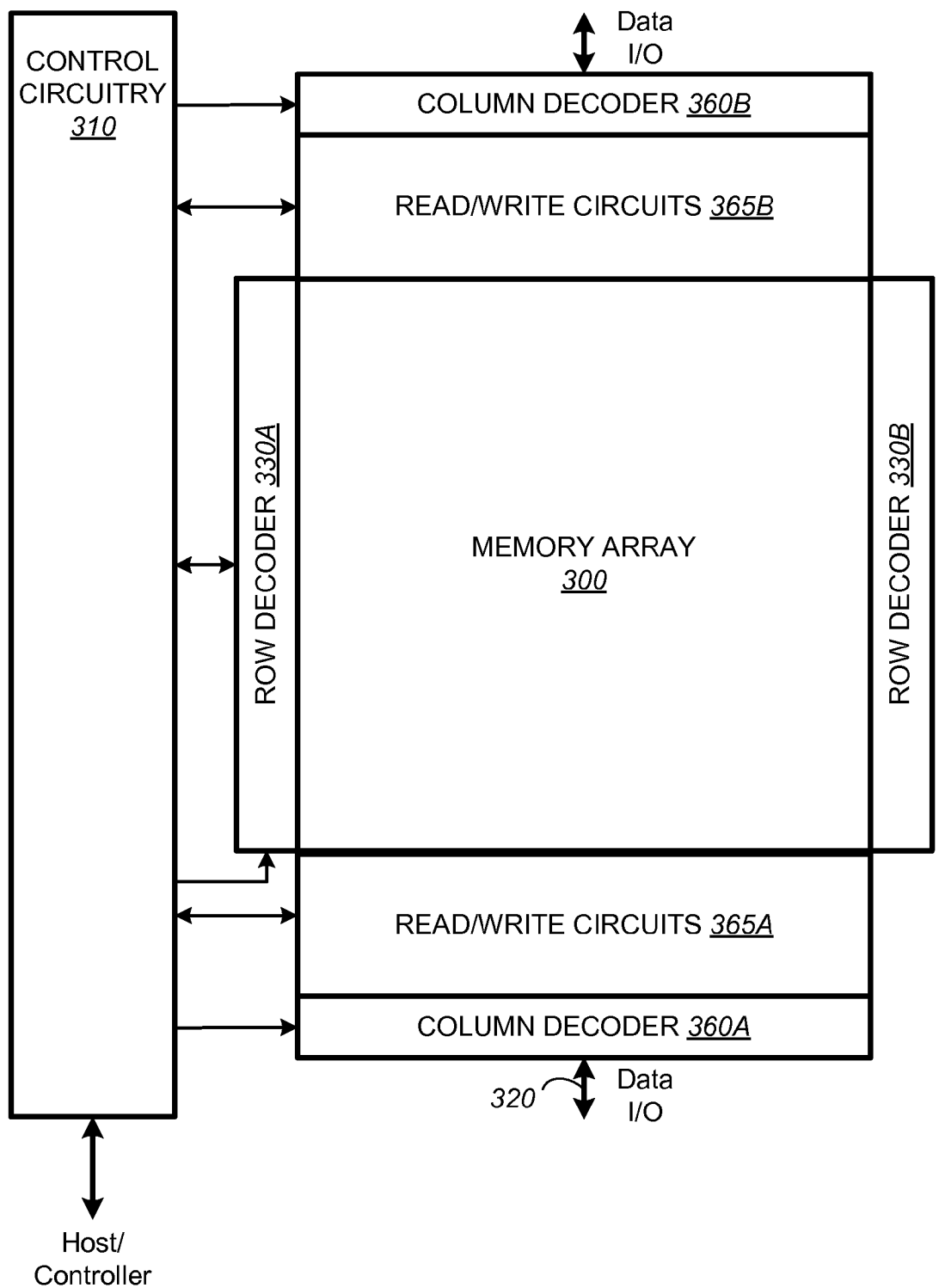
FIG. 6 is a block diagram of a non-volatile memory system.

FIG. 6 illustrates another arrangement of the memory device 296 shown in FIG. 5. Access to the memory array 300 by the various peripheral circuits is implemented in a symmetric fashion, on opposite sides of the array, so that the densities of access lines and circuitry on each side are reduced by half. Thus, the row decoder is split into row decoders 330A and 330B and the column decoder into column decoders 360A and 360B. Similarly, the read/write circuits are split into read/write circuits 365A connecting to bit lines from the bottom and read/write circuits 365B connecting to bit lines from the top of the array 300. In this way, the density of the read/write modules is essentially reduced by one half. The device of FIG. 6 can also include a controller, as described above for the device of FIG. 5.

Figure 7:
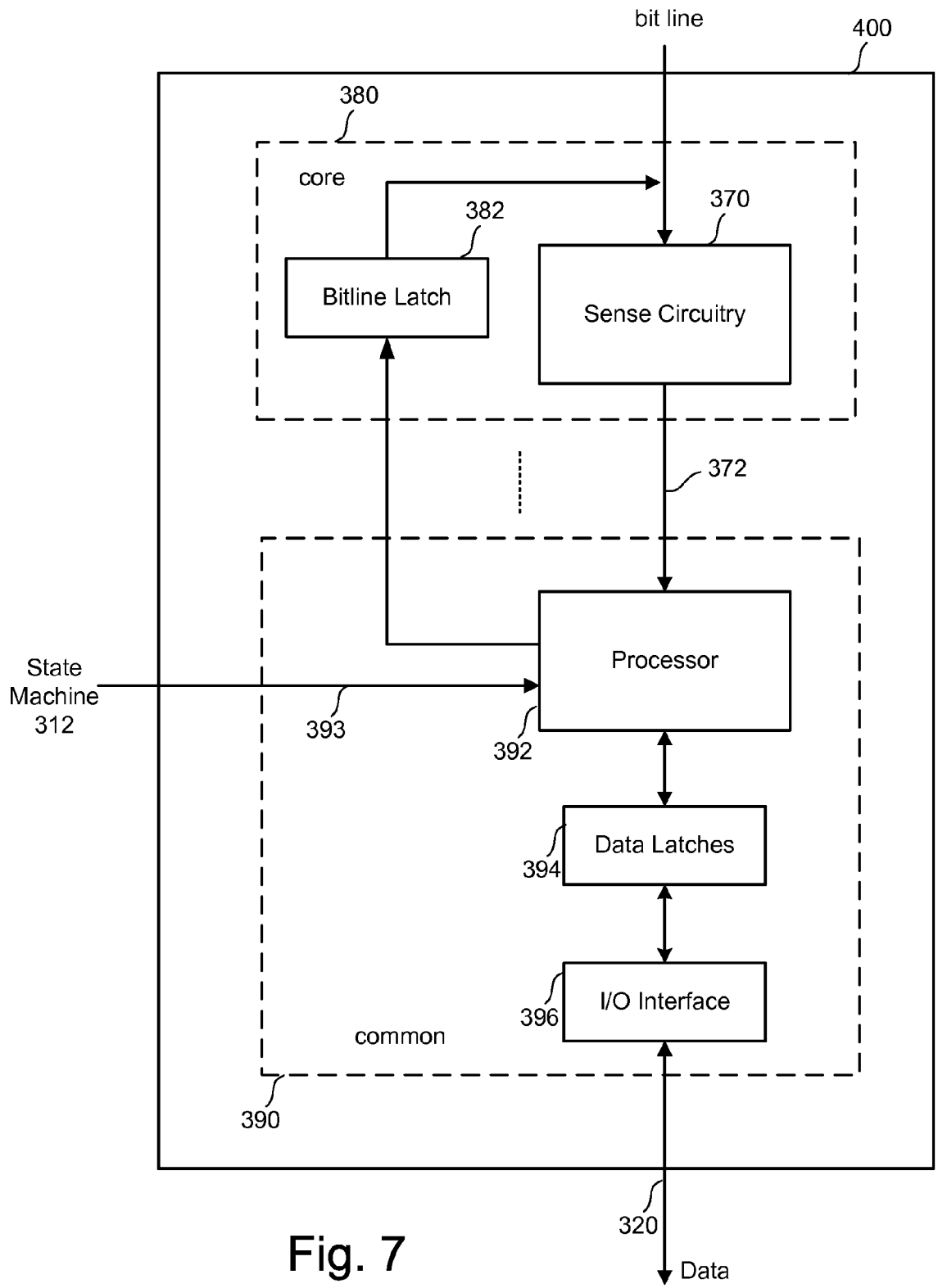
FIG. 7 is a block diagram depicting one embodiment of the sense block.

FIG. 7 is a block diagram of an individual sense block 400 partitioned into a core portion, referred to as a sense module 380, and a common portion 390. In one embodiment, there will be a separate sense module 380 for each bit line and one common portion 390 for a set of multiple sense modules 380. In one example, a sense block will include one common portion 390 and eight sense modules 380. Each of the sense modules in a group will communicate with the associated common portion via a data bus 372. For further details, refer to U.S. patent application Ser. No. 11/026,536 "Non-Volatile Memory & Method with Shared Processing for an Aggregate of Sense Amplifiers" filed on Dec. 29, 2004, which is incorporated herein by reference in its entirety.

Sense module 380 comprises sense circuitry 370 that determines whether a conduction current in a connected bit line is above or below a predetermined threshold level. Sense module 380 also includes a bit line latch 382 that is used to set a voltage condition on the connected bit line. For example, a predetermined state latched in bit line latch 382 will result in the connected bit line being pulled to a state designating program inhibit (e.g., Vdd).

Common portion 390 comprises a processor 392, a set of data latches 394 and an I/O Interface 396 coupled between the set of data latches 394 and data bus 320. Processor 392 performs computations. For example, one of its functions is to determine the data stored in the sensed memory cell and store the determined data in the set of data latches. The set of data latches 394 is used to store data bits determined by processor 392 during a read operation. It is also used to store data bits imported from the data bus 320 during a program operation. The imported data bits represent write data meant to be programmed into the memory. I/O interface 396 provides an interface between data latches 394 and the data bus 320.

During read or sensing, the operation of the system is under the control of state machine 312 that controls the supply of different control gate voltages to the addressed cell. As it steps through the various predefined control gate voltages corresponding to the various memory states supported by the memory, the sense module 380 may trip at one of these voltages and an output will be provided from sense module 380 to processor 392 via bus 372. At that point, processor 392 determines the resultant memory state by consideration of the tripping event(s) of the sense module and the information about the applied control gate voltage from the state machine via input lines 393. It then computes a binary encoding for the memory state and stores the resultant data bits into data latches 394. In another embodiment of the core portion, bit line latch 382 serves double duty, both as a latch for latching the output of the sense module 380 and also as a bit line latch as described above.

It is anticipated that some implementations will include multiple processors 392. In one embodiment, each processor 392 will include an output line (not depicted in FIG. 7) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine needs to read the wired-OR line eight times, or logic is added to processor 392 to accumulate the results of the associated bit lines such that the state machine need only read the wired-OR line one time.

During program or verify, the data to be programmed is stored in the set of data latches 394 from the data bus 320. The program operation, under the control of the state machine, comprises a series of programming voltage pulses applied to the control gates of the addressed memory cells. Each programming pulse is followed by a verify operation to determine if the memory cell has been programmed to the desired state. Processor 392 monitors the verified memory state relative to the desired memory state. When the two are in agreement, the processor 392 sets the bit line latch 382 so as to cause the bit line to be pulled to a state designating program inhibit. This inhibits the cell coupled to the bit line from further programming even if programming pulses appear on its control gate. In other embodiments the processor initially loads the bit line latch 382 and the sense circuitry sets it to an inhibit value during the verify process.

Data latch stack 394 contains a stack of data latches corresponding to the sense module. In one embodiment, there are three data latches per sense module 380. In some implementations (but not required), the data latches are implemented as a shift register so that the parallel data stored therein is converted to serial data for data bus 320, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. patent application Ser. No. 11/015, 199 titled "Improved Memory Sensing Circuit And Method For Low Voltage Operation," Inventor Raul-Adrian Cernea, filed on Dec. 16, 2004; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory", Inventors Siu Lung Chan and Raul-Adrian Cernea, filed on Dec. 28, 2005. All five of the immediately above-listed patent documents are incorporated herein by reference in their entirety.

Figure 7A:
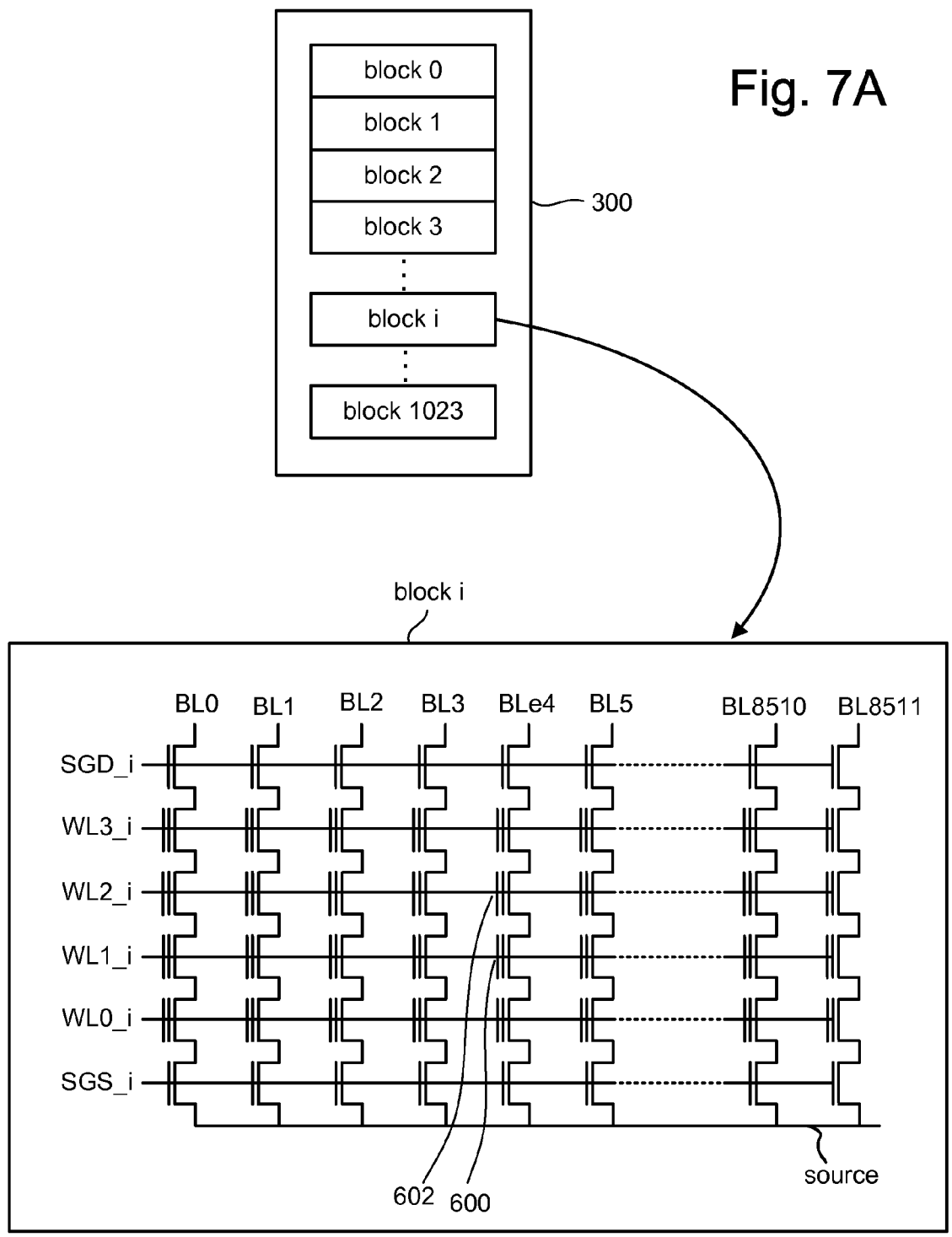
FIG. 7A is a block diagram of a memory array.

With reference to FIG. 7A, an exemplary structure of memory cell array 302 is described. As one example, a NAND flash EEPROM is described that is partitioned into 1,024 blocks. The data stored in each block can be simultaneously erased. In one embodiment, the block is the minimum unit of memory cells that are simultaneously erased. In each block, in this example, there are 8,512 columns corresponding to bit lines BL0, BL1, . . . BL8511. In one embodiment, all the bit lines of a block can be simultaneously selected during read and program operations. Memory cells along a common word line and connected to any bit line can be programmed at the same time.

In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 7A shows four memory cells connected in series to form a NAND string. Although four cells are shown to be included in each NAND string, more or less than four can be used (e.g., 16, 32, or another number). One terminal of the NAND string is connected to a corresponding bit line via a drain select gate (connected to select gate drain line SGD), and another terminal is connected to c-source via a source select gate (connected to select gate source line SGS).

Figure 8:
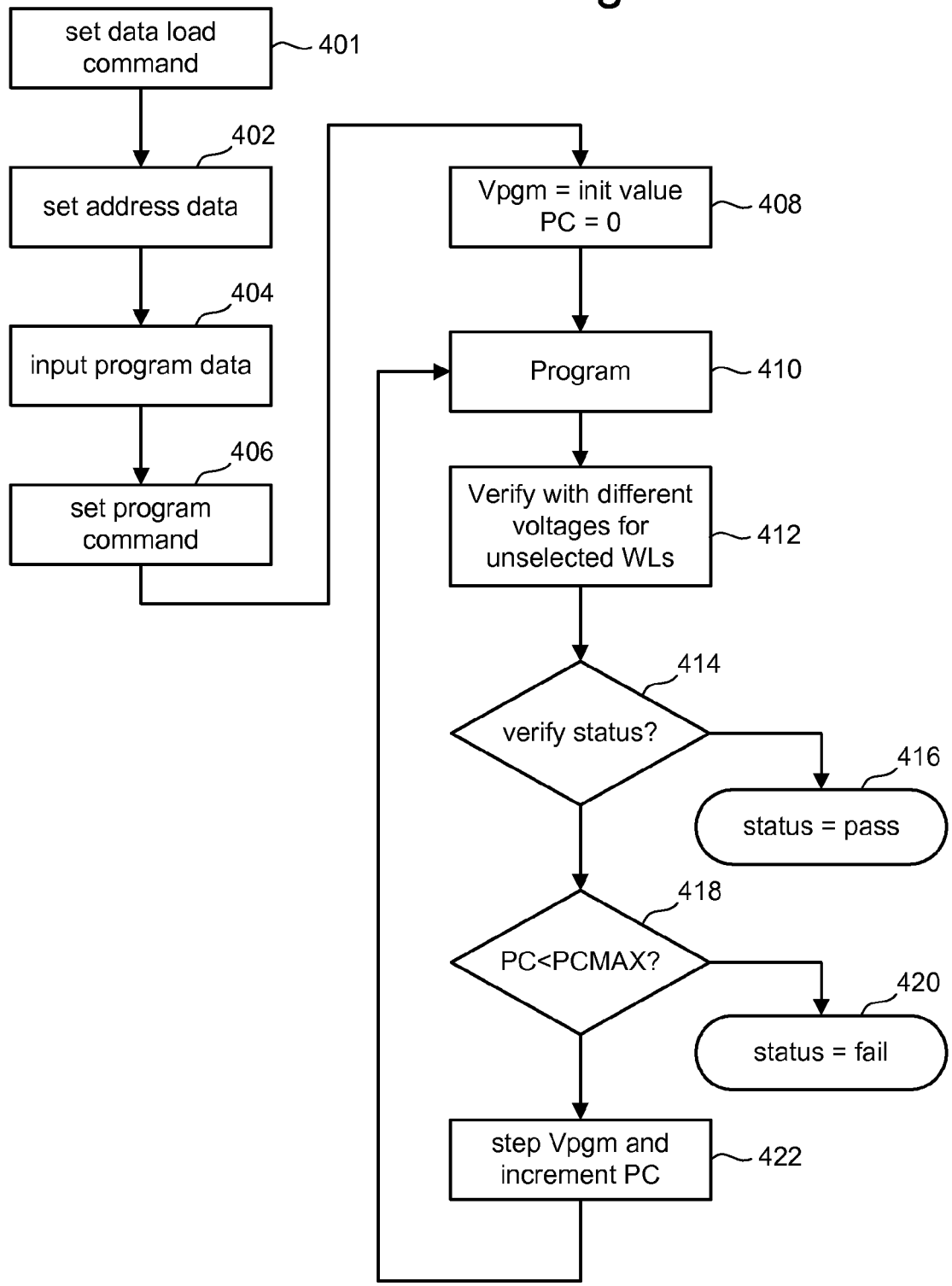
FIG. 8 is a flow chart describing one embodiment of a process for programming non-volatile memory.

FIG. 8 is a flow chart describing one embodiment of a method for programming non-volatile memory. In one implementation, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, separate blocks, or another unit of cells.

In step 401 of FIG. 8, a "data load" command is issued by the controller and received by control circuitry 310. In step 402, address data designating the page address is input to decoder 314 from the controller or host. In step 404, a page of program data for the addressed page is input to a data buffer for programming. That data is latched in the appropriate set of latches. In step 406, a "program" command is issued by the controller to state machine 312.

Triggered by the "program" command, the data latched in step 404 will be programmed into the selected memory cells controlled by state machine 312 using the stepped pulses of FIG. 9 applied to the appropriate word line. In step 408, the program voltage Vpgm is initialized to the starting pulse (e.g., 12V or other value) and a program counter PC maintained by state machine 312 is initialized at 0. In step 410, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to Vdd to inhibit programming.

In step 412, the states of the selected memory cells are verified using different voltage for the unselected word line, as discussed below. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected cells have been programmed. In step 414, it is checked whether all of the data latches are storing logic "1." If so, the programming process is complete and successful because all selected memory cells were programmed and verified. A status of "PASS" is reported in step 416.

If, in step 414, it is determined that not all of the data latches are storing logic "1," then the programming process continues. In step 418, the program counter PC is checked against a program limit value PCMAX. One example of a program limit value is 20; however, other numbers can also be used. If the program counter PC is not less than 20, then the program process has failed and a status of "FAIL" is reported in step 420. In some embodiments, after the maximum number of loops is reached, the system checks whether less than a predetermined amount of cells have not finished programming. If less than that predetermined number has not finished programming, the programming process is still considered pass. If the program counter PC is less than 20, then the Vpgm level is increased by the step size and the program counter PC is incremented in step 422. After step 422, the process loops back to step 410 to apply the next Vpgm pulse.

FIG. 9 shows a series of program pulses that are applied to the word line selected for programming. In between program pulses are a set of verify pulses (not depicted). In some embodiments, there can be a verify pulse for each state that data is being programmed into. In other embodiments, there can be more or less verify pulses.

In one embodiment, data is programmed to memory cells along a common word line. Thus, prior to applying the program pulses of FIG. 9, one of the word lines is selected for programming. This word line will be referred to as the selected word line. The remaining word lines of a block are referred to as the unselected word lines. The selected word line may have one or two neighboring word lines. If the selected word line has two neighboring word lines, then the neighboring word line on the drain side is referred to as the drain side neighboring word line and the neighboring word line on the source side is referred to as the source side neighboring word line. For example, if WL2 of FIG. 7A is the selected word line, then WL1 is the source side neighboring word line and WL3 is the drain side neighboring word line.

Figure 10:
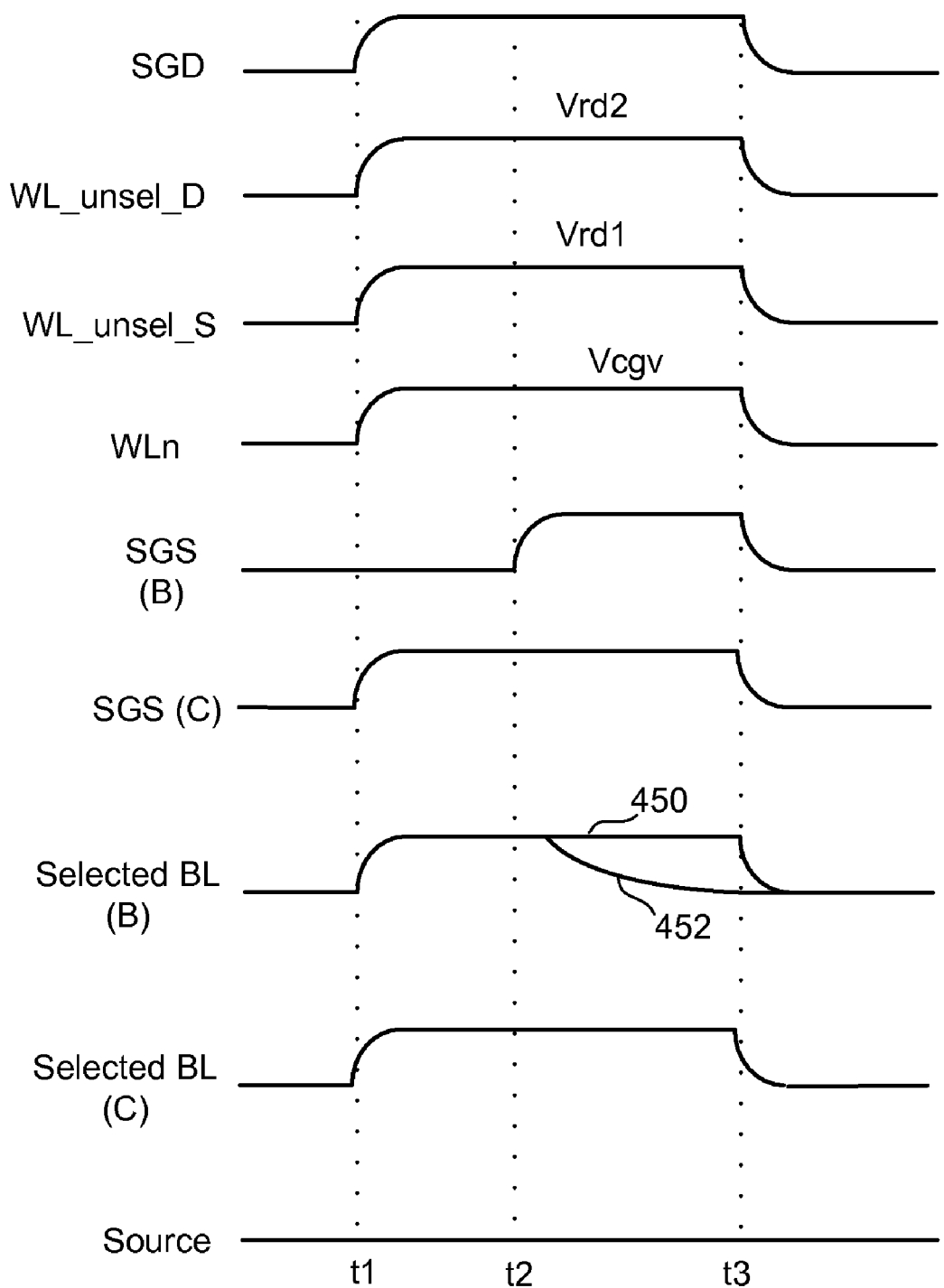
FIG. 10 is a timing diagram that explains the behavior of certain signals during read/verify operations.

FIG. 10 is a timing diagram depicting the behavior of various signals during one iteration of a sensing operation that senses a condition of one or more memory cells. Thus, the process depicted in FIG. 10 can be used to perform a verification operation or (with some modifications discussed below) a read operation. For example, if the memory cells are binary memory cells, the process of FIG. 10 may be performed once for each memory cell during an iteration of step 412. If the memory cells are multi-state memory cells with four states (e.g., E, A, B, and C), the process of FIG. 10 may be performed three times for each memory cell during an iteration of step 412.

In general, during the read and verify operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not.

FIG. 10 shows signals SGD, WL_unsel_D, WL_unsel_S, WLn, SGS, Selected BL, and Source starting at Vss (approximately 0 volts). SGD represents the signal provided to the gate of the drain side select gate. SGS is the signal provided to the gate of the source side select gate. WLn is the signal provided to the word line selected for reading/verification. WL_unsel_S is the signal provided to the unselected word lines that are on the source side of the selected word line WLn. For example, if the selected word line is WL2, then WL_unsel_S is applied to WL0 and WL1. WL_unsel_D is the signal provided to the unselected word lines that are on the drain side of the selected word line WLn. For example, if the selected word line is WL1, then WL_unsel_D is applied to WL2 and WL3 of FIG. 7A. Selected BL is the bit line selected for reading/verification. Source is the source line for the memory cells (see FIG. 7A). Note that there are two versions of SGS and Selected BL depicted in FIG. 10. One set of these signals SGS (B) and Selected BL (B) depict a read/verify operation for an array of memory cells that measure the conduction current of a memory cell by determining whether the bit line has discharged. Another set of these signals SGS (C) and Selected BL (C) depict a read/verify operation for an array of memory cells that measure the conduction current of a memory cell by the rate it discharges a dedicated capacitor in the sense amplifier.

First, the behavior of the sensing circuits and the array of memory cells that are involved in measuring the conduction current of a memory cell during verification by determining whether the bit line has discharged will be discussed with respect to SGS (B) and Selected BL (B). At time t1 of FIG. 10, SGD is raised to Vsg (e.g., approximately 4-4.5 volts), WL_unsel_S are raised to Vrd1 (e.g., approximately 4.5 to 6 volts), WL_unsel_D are raised to Vrd2 (e.g., approximately 2-4 volts lower than Vrd1; however, in other embodiments other values for Vrd2 can be used that are even lower than Vrd1, the selected word line WLn is raised to Vcgv (e.g., Vva, Vvb, or Vvc of FIG. 11) for a verify operation. The selected bit line Selected BL(B) is pre-charged to approximately 0.7 volts. The voltages Vrd1 and Vrd2 act as pass voltages because they are sufficiently high to cause the unselected memory cells to turn on and act as pass gates. At time t2, the source side select gate is turned on by raising SGS (B) to Vsg. This provides a path to discharge the bit line. If the threshold voltage of the memory cell selected for reading is greater than Vcgv applied to the selected word line WLn, then the selected memory cell will not turn on and the bit line will not be discharged, as depicted by signal line 450. If the threshold voltage of the memory cell selected for reading is below Vcgv applied to the selected word line WLn, then the memory cell selected for reading will turn on (conduct) and the bit line will be discharged, as depicted by curve 452. At some point after time t2 and prior to time t3 (as determined by the particular implementation), the sense amplifier will determine whether the bit line has discharged to a sufficiently low voltage level. At time t3, the depicted signals will be lowered to Vss (or another value for standby or recovery). Note that in other embodiments, the timing of some of the signals can be changed.

Next, the behavior of the sensing circuits and the array of memory cells that measure the conduction current of a memory cell during verification by the rate it discharges or charges a dedicated capacitor in the sense amplifier will be discussed with respect to SGS (C) and Selected BL (C). At time t1 of FIG. 10, SGD is raised to Vsg (e.g., approximately 4-4.5 volts), the unselected word lines WL_unsel_S are raised to Vrd1, the unselected word lines WL_unsel_D are raised to Vrd2, and the selected word line WLn is raised to Vcgv (e.g., Vva, Vvb, or Vvc of FIG. 11). In this case, the sense amplifier holds the bit line voltage constant regardless of whether the selected NAND sting is conducting current or not, so the sense amplifier measures the current flowing through the selected NAND string with the bit line "clamped" to that voltage. At some point after time t1 and prior to time t3 (as determined by the particular implementation), the sense amplifier will determine whether the capacitor in the sense amplifier has been discharged or charged to a sufficient amount. At time t3, the depicted signals will be lowered to Vss (or another value for standby or recovery). Note that in other embodiments, the timing of some of the signals can be changed.

A read operation is performed in the same manner as discussed above with respect to FIG. 10, except that Vcgr (e.g., Vra, Vrb, or Vrc of FIG. 11) is applied to WLn and WL_unsel_D will typically receive Vrd1.

FIG. 10A depicts a NAND string and a set of voltages applied to the NAND string during the verify operation depicted in FIG. 10. The NAND string of FIG. 10A includes eight memory cells 464, 466, 468, 470, 472, 474, 476 and 478. Each of those eight memory cells includes a floating gate (FG) and a control gate (CG). Between each of the floating gates are source/drain regions 490. In some implementations, there is a P-type substrate (e.g., Silicon), an N-well within the substrate and a P-well within the N-well (all of which are not depicted to make the drawings more readable). Note that the P-well may contain a so called channel implantation that is usually a P-type implantation that determines or helps to determine the threshold voltage and other characteristics of the memory cells. The source/drain regions 490 are N+ diffusion regions that are formed in the P-well. At one end of the NAND string is a drain side select gate 484. The drain select gate 484 connects the NAND string to the corresponding bit line via bit line contact 494. At another end of the NAND string is a source select gate 482. Source select gate 482 connects the NAND string to common source line 492.

During a verify operation, the selected memory cell 470 receives the verify compare voltage Vcgv. The unselected memory cells 464, 466 and 468 on the source side of selected memory cell 470 receive Vrd1 at their control gates. Memory cells 464, 466 and 468 have already been subjected to one or more programming processes that potentially caused programming of one or more pages of data stored in those memory cells since the last time that the NAND string of FIG. 10A was erased. The unselected memory cells 472, 474, 476 and 478 on the drain side of selected memory cell 470 receive Vrd2 at their control gates. Memory cells 472, 474, 476 and 478 have not been subjected to a programming process that potentially caused programming of one or more pages of data stored in those memory cells since the last time that the NAND string of FIG. 10A was erased. That is, at the time of performing a verification operation on memory cell 470, the unselected memory cells 464, 466 and 468 on the source side of selected memory cell 470 may be in states E, A, B, or C (see FIGS. 11-13). On the other hand, memory cells 472, 474, 476 and 478 on the drain side of selected memory cell 470 will be in the erased state E (see FIGS. 11-13).

Memory cells 464, 466 and 468 are referred to be as being on the source side of selected memory cell 470 because they are on the same NAND string as selected memory cell 470 and on the same side of selected memory cell 470 as source side select gate 482. Although FIG. 10A shows three memory cells on the source side, one or more memory cells can be on the source side. Memory cells 472, 474, 476 and 478 are referred to be as being on the drain side of selected memory cell 470 because they are on the same NAND string as selected memory cell 470 and on the same side of selected memory cell 470 as drain side select gate 484. Although FIG. 10A shows four memory cells on the drain side, one or more memory cells can be on the drain side; or two or more memory cells can be on the drain side.

FIG. 10B depicts a NAND string and a set of voltages applied to the NAND string during a read operation. During a read operation, the selected memory cell 470 receives the read compare voltage Vcgr. All of the unselected memory cells 464, 466, 468, 472, 474, and 476 receive Vread at their control gates. In one embodiment Vread=Vrd1.

Figures 10C, 14:
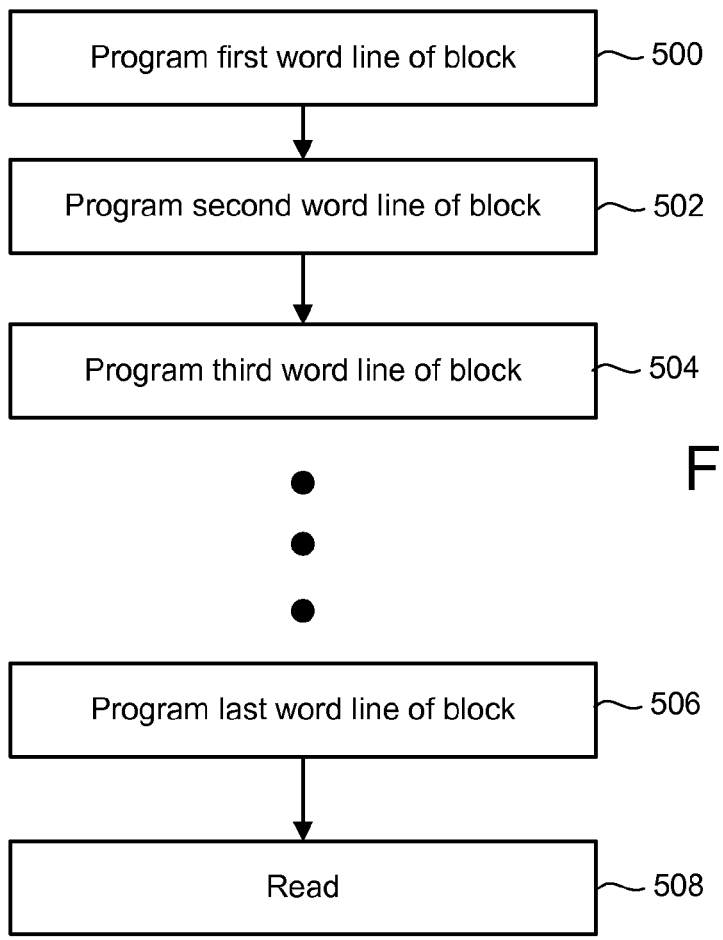
FIG. 10C is a flow chart describing one embodiment of a process for programming and reading.
FIG. 14 is a table depicting the order of programming non-volatile memory in one embodiment.

FIG. 10C is a flow chart describing one embodiment of a process for programming and reading. In many applications, all of the word lines for a block are programmed. Subsequent to that programming, all or a subset of the data may be read one or more times. In some embodiments, the word lines are programmed from the source side to the drain side. For example, in step 500, memory cells connected to a first word line (e.g., WL0) are programmed. In step 502, memory cells connected to a second word line (e.g., WL1) are programmed. In step 504, memory cells connected to a third word line are programmed. And so on, until memory cells connected to the last word line (e.g., the word line next to the drain side select gate) are programmed in step 506. In other embodiments, other orders of programming can also be used, including orders of programming that do not proceed from the source side select gate toward the drain side select gate. After all of the word lines are programmed, any one or more memory cells of the block associated with any of the word lines can be read. Consider the example of a digital camera that stores a set of pictures. It is likely that the pictures will be stored across multiple blocks, thereby, programming all of the word lines prior to any read operations. Note that other order of operation different that as depicted in FIG. 10C can be implemented.

Each word line may be subjected to one or more programming process. For example, a word line may be associated with multiple pages of data. Each programming process may be for a separate page of data. That is, the process of FIG. 8 may be performed separately for each page of data. For example, each of steps 500-506 may include multiple programming processes. In other embodiments, all pages of data associated with a word line may be programmed together or a word line may only be associated with one page of data.

At the end of a successful program (with verification) process, the threshold voltages of the memory cells should be within one or more distributions of threshold voltages for programmed memory cells or within a distribution of threshold voltages for erased memory cells, as appropriate. FIG. 11 illustrates example threshold voltage distributions for the memory cell array when each memory cell stores two bits of data. FIG. 11 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 11 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 11 shows four states, the present invention can also be used with other multi-state structures including those that include more or less than four states.

FIG. 11 also shows three read reference voltages, Vra, Vrb and Vrc, for reading data from memory cells. By testing whether the threshold voltage of a given memory cell is above or below Vra, Vrb and Vrc, the system can determine what state the memory cell is in.

FIG. 11 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erased state E directly to any of the programmed states A, B or C. For example, a population of memory cells to be programmed may first be erased so that all memory cells in the population are in erased state E. While some memory cells are being programmed from state E to state A, other memory cells are being programmed from state E to state B and/or from state E to state C.

FIG. 12 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 530.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 534. If the cell had been programmed into state A as a result of the first programming pass, then the memory cell is further programmed in the second pass so that the threshold voltage is increased to be within state B, as depicted by arrow 532. The result of the second pass is to program the cell into the state designated to store a logic "0" for the upper page without changing the data for the lower page.

In one embodiment, a system can be set up to perform full sequence writing if enough data is written to fill up a word line. If not enough data is written, then the programming process can program the lower page with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

Figure 13A:
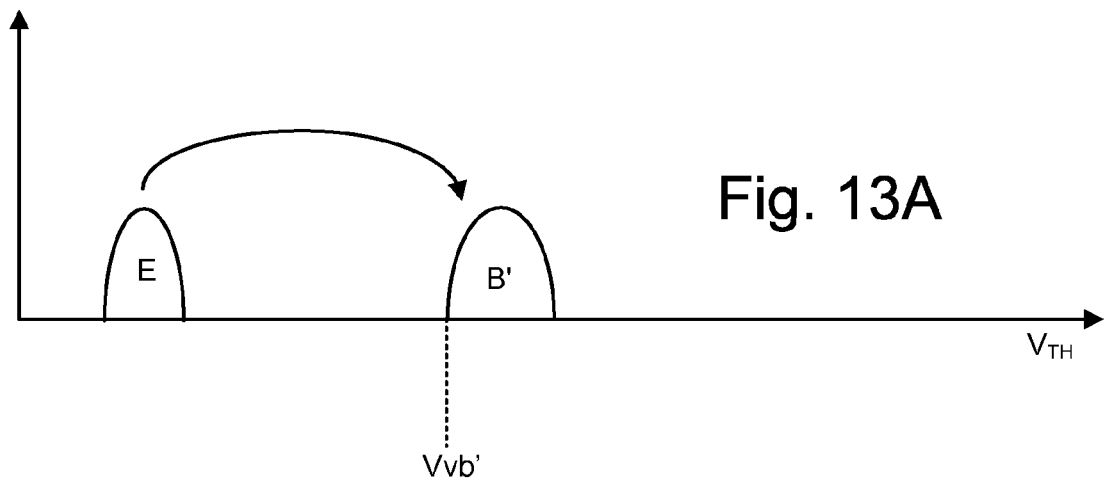
FIGS. 13A-C show various threshold voltage distributions and describe a process for programming non-volatile memory.
Figure 13B:
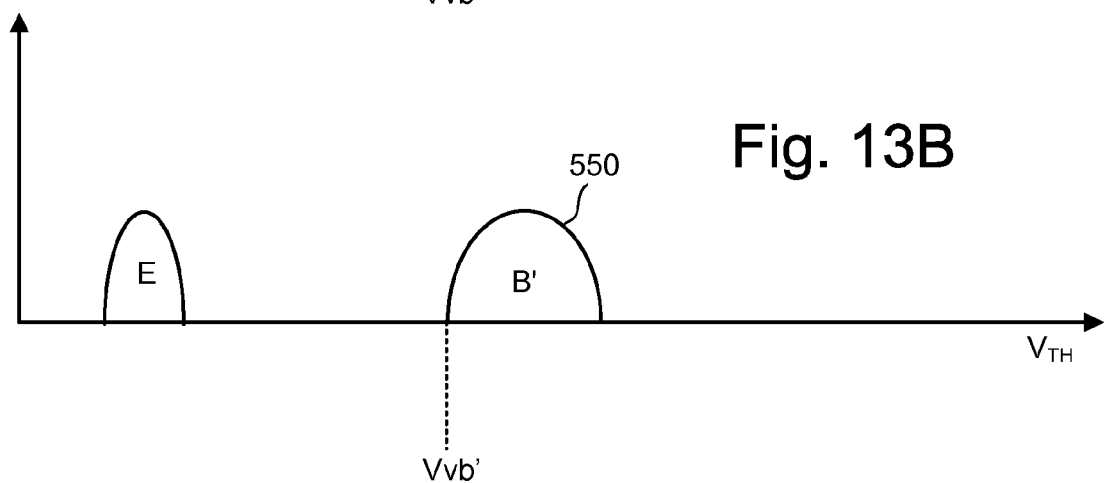
Figure 13C:
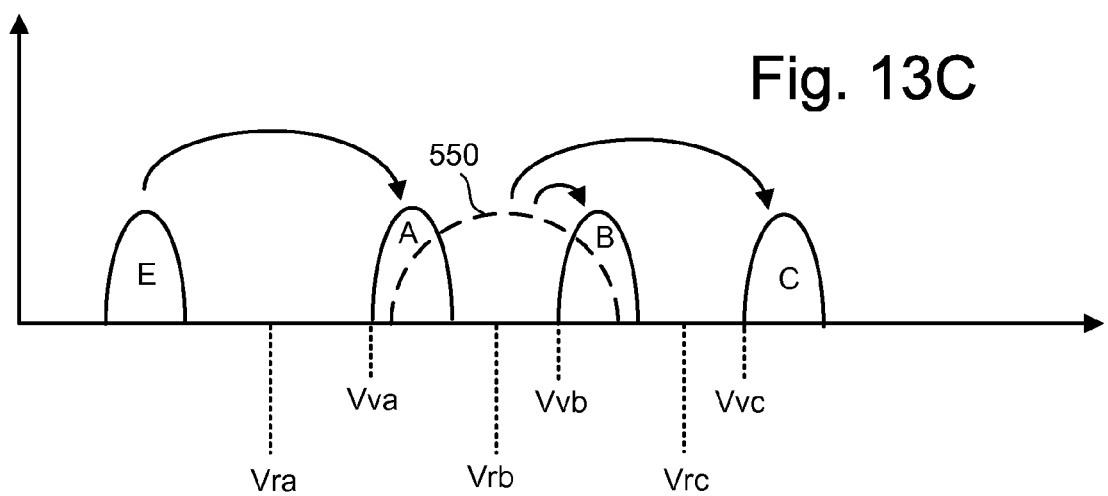

FIGS. 13A-C disclose another process for programming non-volatile memory that reduces the effect of floating gate to floating gate coupling by, for any particular memory cell, writing to that particular memory cell with respect to a particular page subsequent to writing to adjacent memory cells for previous pages. In one example of an implementation of the process taught by FIGS. 13A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B.

Other encodings of data to physical data states can also be used. Each memory cell stores two pages of data. For reference purposes these pages of data will be called upper page and lower page; however, they can be given other labels. With reference to state A for the process of FIGS. 13A-C, the upper page stores bit 0 and the lower page stores bit 1. With reference to state B, the upper page stores bit 1 and the lower page stores bit 0. With reference to state C, both pages store bit data 0.

The programming process of FIGS. 13A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 13A therefore shows the programming of memory cells from state E to state B'. State B' depicted in FIG. 13A is an interim state B; therefore, the verify point is depicted as Vvb', which is lower than Vvb.

In one embodiment, after a memory cell is programmed from state E to state B', its neighbor memory cell (WLn+1) in the NAND string will then be programmed with respect to its lower page. For example, looking back at FIG. 7A, after the lower page for memory cell 600 is programmed, the lower page for memory cell 602 would be programmed. After programming memory cell 602, the floating gate to floating gate coupling effect will raise the apparent threshold voltage of memory cell 600 if memory cell 600 had a threshold voltage raised from state E to state B'. This will have the effect of widening the threshold voltage distribution for state B'. This apparent widening of the threshold voltage distribution will be remedied when programming the upper page.

FIG. 13C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 550 and the upper page data is to remain at 1, then the memory cell will be programmed to final state B. If the memory cell is in intermediate threshold voltage distribution 550 and the upper page data is to become data 0, then the threshold voltage of the memory cell will be raised so that the memory cell is in state C. The process depicted by FIGS. 13A-C reduces the effect of floating gate to floating gate coupling because only the upper page programming of neighbor memory cells will have an effect on the apparent threshold voltage of a given memory cell. An example of an alternate state coding is to move from distribution 550 to state C when the upper page data is a 1, and to move to state B when the upper page data is a 0.

Although FIGS. 13A-C provide an example with respect to four data states and two pages of data, the concepts taught by FIGS. 13A-C can be applied to other implementations with more or less than four states and different than two pages.

FIG. 14 is a table that describes one embodiment of the order for programming memory cells utilizing the programming method of FIGS. 13A-C. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed in numerical order according to page number, from page 0 to page 7. In other embodiments, other orders of programming can also be used, including orders of programming that do not proceed from the source side select gate toward the drain side select gate.

Figure 15:
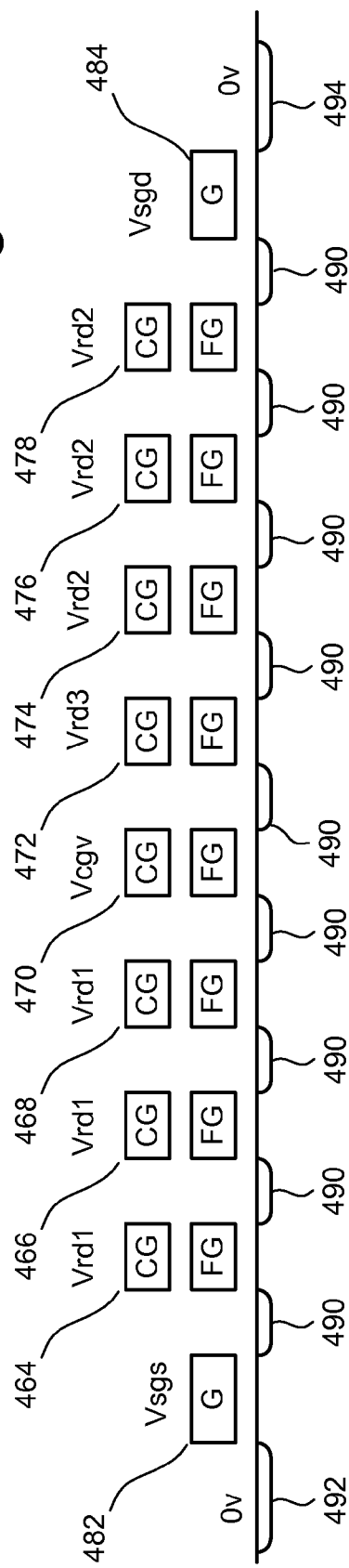
FIG. 15 depicts a NAND string and a set of voltages applied to the NAND string during a verify process.

FIG. 15 shows the bias conditions for a selected NAND string during a verify operation when programming according to the embodiment of FIGS. 13A-C and FIG. 14. Selected memory cell 470 receives Vcgv at its control gate. The unselected memory cells on the source side of selected memory cell 470 receive Vrd1 at their control gates. Memory cell 472, the drain side neighbor of selected memory cell 470, receives Vrd3. The other unselected memory cells on the drain side of selected memory cell 470 receive Vrd2 at their control gates. In one embodiment, Vrd2<Vrd3<Vrd1. In one example, Vrd3 is 1 volts less than Vrd1. In another embodiment, Vrd2<Vrd3≦Vrd1.

With respect to FIGS. 13-15, when the upper page on a selected word line is being written, the word line next to the selected word line on the drain side can already contain data that is in the intermediate state 550. In that case, a word line voltage of Vrd2, will result in too low of a conductivity of the channel area under that memory cell. As a result, the current flowing through the NAND string during a verify operation can be too low and a proper verify operation may not take place. To avoid this, a voltage Vrd3 which is higher than Vrd2 should be applied to that word line.

As described above with respect to FIG. 10C, word lines are typically subjected to programming from the source side to the drain side, and all word lines of a block are usually programmed before reading from any of the word lines. There are some exceptions depending on the implementation, use and/or data. For example, it is possible to attempt to read data from a block prior to subjecting all of the word lines to programming processes. When not all word lines in a NAND string are programmed, the most accurate reading method is to apply the same bias to the unselected word lines as was done during the last verify step on the last programmed word line in that NAND string.

FIGS. 16A-C contemplate the example when memory cells 464, 466, 468, 470 and 472 have been programmed prior to any read operations, but memory cells 474, 476 and 478 have not been programmed. FIG. 16A shows the bias conditions during a verify operation for memory cell 472. Specifically, memory cells 464, 466, 468, and 470 are receiving Vrd1 at their control gates and memory cells 474, 476 and 478 are receiving Vrd2 at their control gates. Selected memory cell 472 receives Vcgv at its control gate.

FIG. 16B depicts the case when there is an attempt to read memory cell 472—the last memory cell programmed for that NAND string. In this example, memory cells 464, 466, 468, and 470 are receiving Vrd1 at their control gates and memory cells 474, 476 and 478 are receiving Vrd2 at their control gates. Selected memory cell 472 receives Vcgr at its control gate.

FIG. 16C depicts the case when there is an attempt to read a memory cell that has been programmed, but it was not the last memory cell for the NAND string to be programmed. In the example, of FIG. 16C, the last memory cell for the NAND string to be programmed is memory cell 472; however, memory cell 468 is selected for programming. Memory cell 468, therefore, received Vcgr at its control gate. Already programmed memory cells 464 and 466 on the source side of memory cell 468 receive Vrd1 at their control gates. Already programmed memory cells 470 and 472 on the drain side of memory cell 468 receive Vrd1 at their control gates. Not yet programmed memory cells 474, 476 and 478 on the drain side of memory cell 468 receive Vrd2 at their control gates. FIG. 16C depicts that memory cells that have been subjected to a programming process receive Vrd1 and those memory cells that have not been subjected to a programming process receive Vrd2. Thus, when word lines below the last programmed word line are read, as depicted in FIG. 16C, the most accurate method is to use the bias of Vrd1 on the unselected word lines that have been programmed already and to use a bias of Vrd2 on the still un-programmed unselected word lines.

Although FIG. 16C shows two memory cells on the source side, one or more memory cells can be on the source side. Although FIG. 16C shows two memory cells on the drain side receiving Vrd1, one or more memory cells can be on the drain side and receive Vrd1. Similarly, one or more (or, two or more) memory cells can be on the drain side and receive Vrd2.

Although the above is the ideal operation, in practical situations this may be complicated as one needs to know up to which word line a certain NAND string is being programmed. This requires extra intelligence and/or data storage in controller circuits or in the NAND memory device itself However, in most cases, using the conventional read operation where Vread is applied to all unselected word lines will be accurate enough. The result of using Vread instead of Vrd2 on the still un-programmed word lines will be that the actual IV characteristics of a certain memory cell during the read operation will be shifted up to a certain extend in comparison with the IV characteristics during the verify operation. As a result, the threshold voltage of the selected memory will appear to be slightly lower than during the verify operation. In general, a threshold voltage shift in a lower direction is not as bad as a shift in a higher direction. A threshold voltage shift upwards can cause so-called over-programming in which the threshold voltage of the memory cell crosses the read level of the next state. As a result, a memory cell that was intended to be programmed to the A-state could be incorrectly read as being a B-state cell. In case the cell shifts in the lower direction, no immediate fail will occur as there is always sufficient margin between the verify level and the read level for a certain state. This margin is usually used to ensure sufficient data retention as the threshold voltage of programmed memory cells tends to shift in the lower direction over time. Besides that, the likelihood that NAND strings are partially programmed is not very high as usually large data files are written and the NAND array is filled in a sequential order nicely filling up NAND string after NAND string with data.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:

1. A non-volatile storage system, comprising:
   a group of connected non-volatile storage elements; and
   a managing circuit in communication with said group of connected non-volatile storage elements, said managing circuit applies a verify reference voltage to a particular non-volatile storage element of said group, while applying said verify reference voltage to said particular non-volatile storage element said managing circuit applies a first voltage to one or more non-volatile storage elements of said group that are on a source side of said particular non-volatile storage element and a second voltage to two or more non-volatile storage elements on a drain side of said particular non-volatile storage element, said managing circuit senses a condition related to said particular non-volatile storage element and verify reference voltage as part of a verify operation during programming, said first voltage is sufficiently high enough to turn on said one or more non-volatile storage elements on said source side of said particular non-volatile storage element, said second voltage is sufficiently high enough to turn on said two or more non-volatile storage elements on said drain side of said particular non-volatile storage element, said second voltage is lower than said first voltage, said managing circuit performs a read process for said particular non-volatile storage element, said read process is performed by said managing circuit applying a common control gate voltage to said one or more non-volatile storage elements of said group that are on said source side and to said two or more non-volatile storage elements of said group that are on said drain side.

2. A non-volatile storage system according to claim 1, wherein:
said group of connected non-volatile storage elements are NAND flash memory devices that are part of a common NAND string.

3. A non-volatile storage system according to claim 1, wherein:
said managing circuit applies a third voltage to a non-volatile storage element that is a neighbor of said particular non-volatile storage element.

4. A non-volatile storage system according to claim 1, wherein:
said managing circuit applies said first voltage to one or more non-volatile storage elements on said drain side of said particular non-volatile storage element while applying said verify reference voltage to said particular non-volatile storage element.

5. A non-volatile storage system, comprising:
a group of connected non-volatile storage elements; and
a managing circuit in communication with said group of connected non-volatile storage elements, said managing circuit applies a particular voltage to a particular non-volatile storage element of a group of connected non-volatile storage elements, said managing circuit applies a first voltage to one or more non-volatile storage elements of said group that are on a source side of said particular non-volatile storage element, said managing circuit applies a second voltage to a first set of one or more non-volatile storage elements of said group that are on a drain side of said particular non-volatile storage element and said first voltage to a second set of one or more non-volatile storage elements of said group that are on said drain side of said particular non-volatile storage element, said managing circuit senses a condition related to said particular non-volatile storage element as part of a read operation that includes said applying of said first voltage, said second voltage and said particular voltage, said second set of one or more non-volatile storage elements are programmed prior to said sensing said condition, said first set of one or more non-volatile storage elements are not programmed prior to said sensing said condition,
wherein said second voltage is different than said first voltage.

6. A non-volatile storage system according to claim 5, wherein:
one of said second set of one or more non-volatile storage is next to said particular non-volatile storage element;
said group of connected non-volatile storage elements are NAND flash memory devices that are part of a common NAND string; and
said second voltage is lower than said first voltage.

7. A non-volatile storage system according to claim 5, wherein: said second voltage is lower than said first voltage.

* * * * *